(12) United States Patent
Huh et al.

(10) Patent No.: US 10,782,350 B2
(45) Date of Patent: Sep. 22, 2020

(54) APPARATUS AND METHOD FOR DIAGNOSING FAILURE OF SWITCH ELEMENT

(71) Applicant: LG CHEM, LTD., Seoul (KR)

(72) Inventors: Geun-Hoe Huh, Daejeon (KR); Jong-Cheol Lee, Daejeon (KR)

(73) Assignee: LG CHEM, LTD., Seoul (KR)

( * ) Notice: Subject to any disclaimer, the term of this patent is extended or adjusted under 35 U.S.C. 154(b) by 377 days.

(21) Appl. No.: 15/738,749

(22) PCT Filed: Feb. 20, 2017

(86) PCT No.: PCT/KR2017/001856
§ 371 (c)(1),
(2) Date: Dec. 21, 2017

(87) PCT Pub. No.: WO2017/142385
PCT Pub. Date: Aug. 24, 2017

(65) Prior Publication Data
US 2018/0188326 A1     Jul. 5, 2018

(30) Foreign Application Priority Data

Feb. 19, 2016    (KR) .................. 10-2016-0019936

(51) Int. Cl.
*G01R 31/327*    (2006.01)
*G01R 19/165*    (2006.01)
(Continued)

(52) U.S. Cl.
CPC ... *G01R 31/3278* (2013.01); *G01R 19/16504* (2013.01); *G01R 19/16542* (2013.01);
(Continued)

(58) Field of Classification Search
CPC .... G01R 31/327; G01R 19/165; G01R 31/36; G01R 31/02; G01R 31/3278;
(Continued)

(56) References Cited

U.S. PATENT DOCUMENTS

2007/0221627 A1    9/2007  Yugou et al.
2011/0109275 A1    5/2011  Taniguchi
(Continued)

FOREIGN PATENT DOCUMENTS

EP    2 897 242 A1    7/2015
JP    2009-60734 A    3/2009
(Continued)

OTHER PUBLICATIONS

Machine English translation of KR 10-0709841-B (Publication date Apr. 23, 2007).
(Continued)

*Primary Examiner* — Jermele M Hollington
*Assistant Examiner* — Suresh K Rajaputra
(74) *Attorney, Agent, or Firm* — Birch, Stewart, Kolasch & Birch, LLP

(57) ABSTRACT

Disclosed are an apparatus and method of diagnosing a failure of a switch element used to switch on or off external connection of a battery. The apparatus according to the present disclosure is an apparatus for diagnosing a failure of a switch element provided on a first line between a first electrode of a battery and a first external terminal, the apparatus including a current measuring unit configured to measure a current flowing through a second line between a second electrode of the battery and a second external terminal, a diagnosis resistor and a diagnosis switch provided on a third line to connect an outer node of the switch element and an outer node of the current measuring unit, and connected to each other in series, and a controller configured to apply a control signal for turning on or off the switch element, to the switch element, to turn on the diagnosis switch after the control signal is applied and then receive a measured current value from the current measuring unit, to determine a level of the current flowing through the second (Continued)

line, by using the measured current value, and to diagnose a failure of the switch element by comparing the current level to a reference current level.

15 Claims, 5 Drawing Sheets

(51) Int. Cl.
*G01R 31/36* (2020.01)
*G01R 31/02* (2006.01)
*G01R 31/364* (2019.01)
*G08C 19/02* (2006.01)
*G01R 31/50* (2020.01)
*G01R 31/40* (2020.01)
*H01H 47/00* (2006.01)

(52) U.S. Cl.
CPC ..... *G01R 19/16571* (2013.01); *G01R 31/364* (2019.01); *G01R 31/50* (2020.01); *G08C 19/02* (2013.01); *G01R 31/40* (2013.01); *H01H 47/002* (2013.01)

(58) Field of Classification Search
CPC ............ G01R 19/16504; G01R 31/026; G01R 31/3696; G01R 31/025; G01R 19/16571
See application file for complete search history.

(56) References Cited

U.S. PATENT DOCUMENTS

2013/0009648 A1   1/2013  Tae
2013/0320986 A1* 12/2013  Shiraishi .............. G01R 31/327
                                                    324/415

FOREIGN PATENT DOCUMENTS

| JP | 2011-205755 A | 10/2011 |
| JP | 2012-100438 A | 5/2012 |
| JP | 2015-95442 A | 5/2015 |
| JP | 2015-128361 A | 7/2015 |
| KR | 10-0709841 B1 | 4/2007 |
| KR | 10-2013-0051228 A | 5/2013 |
| KR | 10-2014-0020765 A | 2/2014 |
| KR | 10-2014-0072489 A | 6/2014 |
| KR | 10-2014-0136844 A | 12/2014 |

OTHER PUBLICATIONS

Machine English translation of KR 10-2013-0051228-A (Publication date May 20, 2013).
International Search Report (PCT/ISA/210) issued in PCT/KR2017/001856, dated May 15, 2017.

* cited by examiner

APPARATUS AND METHOD FOR DIAGNOSING FAILURE OF SWITCH ELEMENT

TECHNICAL FIELD

The present disclosure relates to an apparatus and method of diagnosing a failure of a switch element used to turn on or off external connection of a battery.

The present application claims priority to Korean Patent Application No. 10-2016-0019936 filed on Feb. 19, 2016 in the Republic of Korea, the disclosure of which is incorporated herein by reference.

BACKGROUND ART

Batteries are rapidly popularized not only in mobile devices (e.g., mobile phones, laptop computers, smartphones, and smartpads) but also in electricity-driven vehicles (e.g., electric vehicles (EVs), hybrid electric vehicles (HEV), and plug-in hybrid electric vehicles (PHEVs)), high-capacity energy storage systems (ESSs), etc.

A battery is connected to an external power line through a switch element. The switch element is turned on or off by a control signal.

When the switch element is turned on, charge or discharge of the battery is enabled in association with the power line. Otherwise, when the switch element is turned off, a system connection with the power line is cut and thus the charge or discharge is interrupted.

When the switch element has a failure, the external connection of the battery may not be appropriately controlled. The failure of the switch element is divided into a short circuit failure and an open circuit failure.

The short circuit failure refers to a failure in which the switch element is constantly maintained in a turn-on state irrespective of the control signal. On the other hand, the open circuit failure refers to a failure in which the switch element is constantly maintained in a turn-off state irrespective of the control signal.

Among the above-described failures of the switch element, the short circuit failure is more serious. The short circuit failure results from various causes. For example, in a mechanical switch element such as a relay, a short circuit failure may occur when contact points are fused thereby to be in contact with each other. As another example, in a semiconductor switch such as a solid state relay (SSR), a short circuit failure may occur when insulation is permanently broken because characteristics of a semiconductor material deteriorate and thus a threshold voltage is excessively lowered.

The short circuit failure causes overcharge or overdischarge of the battery. The overcharge and overdischarge not only deteriorate performance of the battery but also cause overheating and, in a worse case, explosion of the battery.

Therefore, a technology of detecting a short circuit failure of a switch element and appropriately solving the short circuit failure is required.

The short circuit failure of the switch element may be easily diagnosed by measuring a voltage of two terminal ends of the switch element. That is, although a turn-off control signal is applied to the switch element, if the voltage between the two terminal ends of the switch element is close to zero, it may be diagnosed that the switch element has a short circuit failure.

The fact that the voltage between the two terminal ends of the switch element is close to zero means that the switch element does not respond to the turn-off control signal and is constantly maintained in a turn-on state.

The above-described failure diagnosis method may have a simple algorithm but may not be applied to a case when a battery is connected to direct current (DC) parallel link nodes and a voltage of the DC parallel link nodes is substantially the same as a voltage of the battery.

An example of the DC parallel link nodes includes parallel connection nodes between two batteries of different types when the two batteries are connected in parallel.

When the battery is connected through the switch element to the DC parallel link nodes, although the switch element is normally turned off, the voltage of the DC parallel link nodes is applied to an outer node of the switch element and the voltage of the battery is applied to an inner node of the switch element. However, since little or no difference is present between the voltage of the DC parallel link nodes and the voltage of the battery, a voltage difference between the two terminal ends of the switch element substantially has a value close to zero. Consequently, even when the switch element does not have a short circuit failure, it may be incorrectly diagnosed that a short circuit failure has occurred.

DISCLOSURE

Technical Problem

The present disclosure is designed to solve the problems of the related art, and therefore the present disclosure is directed to providing an apparatus and method capable of easily diagnosing a failure of a switch element used for external connection of a battery.

The present disclosure is also directed to providing an apparatus and method capable of reliably diagnosing a failure of a switch element when a battery is connected through the switch element to direct current (DC) parallel link nodes to which a voltage substantially equal to the voltage of the battery is applied.

Technical Solution

In one aspect of the present disclosure, there is provided an apparatus for diagnosing a failure of a switch element provided on a first line between a first electrode of a battery and a first external terminal, the apparatus including a current measuring unit configured to measure a current flowing through a second line between a second electrode of the battery and a second external terminal, a diagnosis resistor and a diagnosis switch provided on a third line to connect an outer node of the switch element and an outer node of the current measuring unit, and connected to each other in series, and a controller configured to apply a control signal for turning on or off the switch element, to the switch element, to turn on the diagnosis switch after the control signal is applied and then receive a measured current value from the current measuring unit, to determine a level of the current flowing through the second line, by using the measured current value, and to diagnose a failure of the switch element by comparing the current level to a reference current level.

According to an aspect, the controller may be configured to apply a control signal for turning off the switch element, to the switch element, and to diagnose that the switch element has a short circuit failure, if the current level is greater than the reference current level.

According to another aspect, the controller may be configured to apply a control signal for turning on the switch element, to the switch element, and to diagnose that the switch element has an open circuit failure, if the current level is less than the reference current level.

Preferably, the first and second lines may be connected to direct current (DC) parallel link nodes to which a voltage equal to a voltage of the battery is applied.

The apparatus according to the present disclosure may further include a first voltage measuring unit configured to measure the voltage of the battery, and a second voltage measuring unit configured to measure the voltage of the DC parallel link nodes.

According to an aspect, the controller may be configured (i) to apply a control signal for turning off the switch element, to the switch element, (ii) to receive a first measured voltage value indicating the voltage of the battery and a second measured voltage value indicating the voltage of the DC parallel link nodes from the first and second voltage measuring units, respectively, and receive the measured current value of the second line from the current measuring unit, (iii) to diagnose that the switch element is normal, if a difference between the first and second measured voltage values is greater than a reference voltage level, and (iv) to diagnose that the switch element has a short circuit failure, if the difference between the first and second measured voltage values is less than the reference voltage level and if the level of the current flowing through the second line is greater than the reference current level.

According to another aspect, the controller may be configured (i) to apply a control signal for turning on the switch element, to the switch element, (ii) to receive a first measured voltage value indicating the voltage of the battery and a second measured voltage value indicating the voltage of the DC parallel link nodes from the first and second voltage measuring units, respectively, and receive the measured current value of the second line from the current measuring unit, (iii) to diagnose that the switch element has an open circuit failure, if a difference between the first and second measured voltage values is greater than a reference voltage level, and (iv) to diagnose that the switch element is normal, if the difference between the first and second measured voltage values is less than the reference voltage level and if the level of the current flowing through the second line is greater than the reference current level.

In the present disclosure, the reference current level used for reference to diagnose a short circuit failure of the switch element may include a plurality of current values having different magnitudes. In this case, the controller may be configured to diagnose that the switch element has a short circuit failure, if the level of the current flowing through the second line is greater than a maximum current value among the current values set as the reference current level.

In addition, the controller may be configured to identify a current value corresponding to the level of the current flowing through the second line among the current values set as the reference current level, and to diagnose that the switch element has a pre-defined weak short circuit failure corresponding to the identified current value.

Preferably, the controller may be configured to identify a maximum current value among current values less than or equal to the level of the current flowing through the second line among the current values set as the reference current level, and to diagnose that the switch element has a pre-defined weak short circuit failure corresponding to the identified maximum current value. The weak short circuit failure may be pre-defined in a plurality of stages based on magnitudes of the current values set as the reference current level.

The apparatus according to another aspect of the present disclosure may further include a storage unit configured to store diagnosis information of the switch element, and the controller may be configured to store the diagnosis information of the switch element in the storage unit.

The apparatus according to still another aspect of the present disclosure may further include a display unit configured to display diagnosis information of the switch element, and the controller may be configured to visually output the diagnosis information of the switch element on the display unit.

The apparatus according to still another aspect of the present disclosure may further include a communication interface capable of transmitting or receiving communication data, and the controller may be configured to generate communication data including diagnosis information of the switch element, and to output the generated communication data through the communication interface to an external device.

In another aspect of the present disclosure, there is also provided a method of diagnosing a failure of a switch element provided on a first line between a first electrode of a battery and a first external terminal, the method including (a) providing a current measuring unit configured to measure a current flowing through a second line between a second electrode of the battery and a second external terminal, and a diagnosis resistor and a diagnosis switch provided on a third line to connect an outer node of the switch element and an outer node of the current measuring unit, and connected to each other in series, (b) applying a control signal for turning off the switch element, to the switch element, (c) turning on the diagnosis switch after the control signal is applied and then receiving a measured current value from the current measuring unit, and (d) determining a level of the current flowing through the second line, by using the measured current value, and diagnosing that the switch element has a short circuit failure, if the current level is greater than a pre-defined reference current level.

In another aspect of the present disclosure, there is also provided a method of diagnosing a failure of a switch element provided on a first line between a first electrode of a battery and a first external terminal, the method including (a) providing a current measuring unit configured to measure a magnitude of a current flowing through a second line between a second electrode of the battery and a second external terminal, and a diagnosis resistor and a diagnosis switch provided on a third line to connect an outer node of the switch element and an outer node of the current measuring unit, and connected to each other in series, (b) applying a control signal for turning on the switch element, to the switch element, (c) turning on the diagnosis switch after the control signal is applied and then receiving a measured current value from the current measuring unit, and (d) determining a level of the current flowing through the second line, by using the measured current value, and diagnosing that the switch element has an open circuit failure, if the current level is less than a pre-defined reference current level.

In another aspect of the present disclosure, there is also provided a method of diagnosing a failure of a switch element provided between a first external terminal connected to direct current (DC) parallel link nodes, and a first electrode of a battery, the method including (a) providing a current measuring unit configured to measure a magnitude of a current flowing through a second line between a second electrode of the battery and a second external terminal, first and second voltage measuring units configured to measure a voltage of the battery and a voltage of the DC parallel link nodes, respectively, and a diagnosis resistor and a diagnosis switch provided on a third line to connect an outer node of the switch element and an outer node of the current measuring unit, and connected to each other in series, (b) applying a control signal for turning off the switch element, to the switch element, (c) turning on the diagnosis switch after the control signal is applied, (d) receiving a first measured voltage value indicating the voltage of the battery and a second measured voltage value indicating the voltage of the DC parallel link nodes from the first and second voltage measuring units, respectively, (e) receiving a measured current value from the current measuring unit and determining a level of the current flowing through the second line, by using the measured current value, (f) diagnosing that the switch element has a short circuit failure, if a difference between the first and second measured voltage values is less than a pre-defined reference voltage level and if the level of the current flowing through the second line is greater than a reference current level, and (g) diagnosing that the switch element is normal, if the difference between the first and second measured voltage values is greater than the reference voltage level.

In another aspect of the present disclosure, there is also provided a method of diagnosing a failure of a switch element provided on a first line between a first external terminal connected to direct current (DC) parallel link nodes, and a first electrode of a battery, the method including (a) providing a current measuring unit configured to measure a magnitude of a current flowing through a second line between a second electrode of the battery and a second external terminal, first and second voltage measuring units configured to measure a voltage of the battery and a voltage of the DC parallel link nodes, respectively, and a diagnosis resistor and a diagnosis switch provided on a third line to connect an outer node of the switch element and an outer node of the current measuring unit, and connected to each other in series, (b) applying a control signal for turning on the switch element, to the switch element, (c) turning on the diagnosis switch after the control signal is applied, (d) receiving a first measured voltage value indicating the voltage of the battery and a second measured voltage value indicating the voltage of the DC parallel link nodes from the first and second voltage measuring units, respectively, (e) receiving a measured current value from the current measuring unit and determining a level of the current flowing through the second line, (f) diagnosing that the switch element has an open circuit failure, if a difference between the first and second measured voltage values is greater than a pre-defined reference voltage level, and (g) diagnosing that the switch element is normal, if the difference between the first and second measured voltage values is less than the pre-defined reference voltage level and if the level of the current flowing through the second line is greater than a pre-defined reference current level.

In the present disclosure, the reference current level used for reference to diagnose a short circuit failure of the switch element may include a plurality of current values having different magnitudes. In this case, the diagnosing that the switch element has a short circuit failure may include diagnosing that the switch element has a short circuit failure, if the level of the current flowing through the second line is greater than a maximum current value among the current values set as the reference current level.

In addition, the diagnosing that the switch element has a short circuit failure may include identifying a maximum current value among current values less than or equal to the level of the current flowing through the second line among the current values set as the reference current level, and diagnosing that the switch element has a pre-defined weak short circuit failure corresponding to the identified maximum current value. The weak short circuit failure may be pre-defined in a plurality of stages based on magnitudes of the current values set as the reference current level.

Optionally, the method according to the present disclosure may further include generating failure diagnosis information of the switch element, and storing, displaying, or transmitting the generated failure diagnosis information.

Advantageous Effects

According to the present disclosure, a failure of a switch element used for external connection of a battery may be diagnosed using a simple hardware configuration irrespective of the level of a voltage applied to an external terminal of the battery.

Furthermore, according to the present disclosure, a sensor element used to measure a charge or discharge current of the battery may also be used to diagnose a failure of the switch element and thus costs of a diagnosis apparatus may be reduced.

In addition, according to the present disclosure, occurrence of a weak short circuit failure in the switch element may also be accurately diagnosed.

Moreover, the present disclosure may be useful for a parallel power system in which the external terminal of the battery is connected to another type of battery in parallel.

DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

FIG. 3 is a view showing the flow of a current in the circuit of FIG. 1 when the switch element is turned on.

MODE FOR DISCLOSURE

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation. Therefore, the description proposed herein is just a preferable example for the purpose of illustrations only, not intended to limit the scope of the disclosure, so it should be understood that other equivalents and modifications could be made thereto without departing from the scope of the disclosure.

Figure 1:
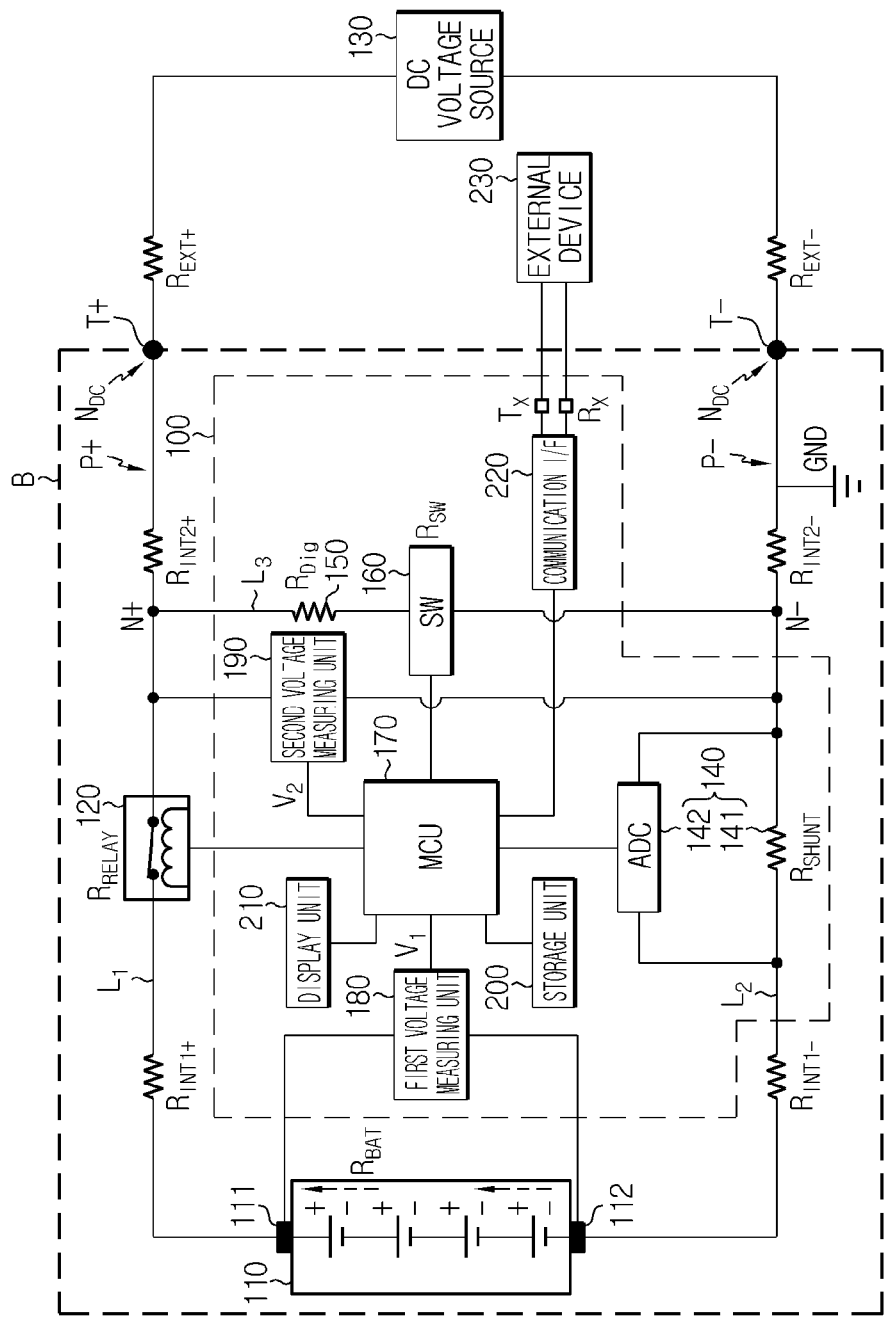
FIG. 1 is a structural view of an apparatus for diagnosing a failure of a switch element, according to an embodiment of the present disclosure.

FIG. 1 is a structural view of an apparatus 100 for diagnosing a failure of a switch element 120, according to an embodiment of the present disclosure.

Referring to the drawing, the switch element failure diagnosis apparatus 100 according to the present disclosure may diagnose a failure of the switch element 120 used to connect or disconnect a first electrode 111 and a second electrode 112 of the battery 110 to or from a first power line P+ and a second power line P− at the outside thereof.

The battery 110 is not limited to a particular type and may be, for example, a lithium battery, a lithium polymer battery, a nickel-cadmium battery, a nickel-hydrogen battery, or a nickel-zinc battery.

The battery 110 is provided as a pack in which a plurality of battery cells are connected in series or in parallel. Alternatively, the battery 110 may include a plurality of the packs.

The first and second electrodes 111 and 112 of the battery 110 may be a positive electrode and a negative electrode, respectively.

The switch element 120 is not limited to a particular type and may be a relay switch in which contact points are open or closed by an electromagnet, as shown in the drawing.

It will be understood by those skilled in the art that the switch element 120 may be a semiconductor switch, e.g., a solid state relay (SSR) or a metal oxide silicon field effect transistor (MOSFET), other than the relay switch.

On and off states of the switch element 120 may be controlled by an external control signal. The control signal may be input from a controller 170 to be described below.

When the switch element 120 is turned on, the battery 110 is electrically coupled to the external first and second power lines P+ and P−. After the electrical coupling is achieved, the battery 110 may transmit discharge power to or receive charge power from outside. Otherwise, when the switch element 120 is turned off, the electrical coupling between the battery 110 and the first and second power lines P+ and P− is released and thus the transmission or reception of power to or from outside is stopped.

The failure of the switch element 120 is divided into a short circuit failure and an open circuit failure. The short circuit failure refers to a case when the switch element 120 is turned off but is internally constantly maintained in a turn-on state. Such failure occurs when contact points included in the switch element 120 are fused thereby to be in contact with each other due to heat. Meanwhile, the open circuit failure refers to a case when the switch element 120 is turned on but is internally constantly maintained in a turn-off state. Such failure occurs due to deterioration of an operating mechanism which causes mechanical, electrical, or magnetic contact between the contact points.

An end of the first power line P+ may be electrically connected to a first external terminal T+. The first external terminal T+ is electrically connected to the first electrode 111 of the battery 110 through the switch element 120 provided on a first line $L_1$. Herein, the first line $L_1$ refers to a line extending from the first electrode 111 of the battery 110 to the first external terminal T+.

An end of the second power line P− may be electrically connected to a second external terminal T−. The second external terminal T− is electrically connected to the second electrode 112 of the battery 110 through a second line $L_2$. Herein, the second line $L_2$ refers to a line extending from the second electrode 112 of the battery 110 to the second external terminal T−.

The first and second power lines P+ and P− may be used as a conductive path through which a discharge current output from the battery 110 flows or a conductive path through which a charge current input to the battery 110 flows.

In an embodiment, another end of the first power line P+ may be connected to a positive terminal of a direct current (DC) voltage source 130, and another end of the second power line P− may be connected to a negative terminal of the DC voltage source 130.

A node where the first external terminal T+ meets the first power line P+ and a node where the second external terminal T− meets the second power line P−serve as DC parallel link nodes $N_{DC}$.

Therefore, the DC voltage source 130 is electrically connected to the first and second lines $L_1$ and $L_2$ through the DC parallel link nodes $N_{DC}$. Then, the DC voltage source 130 and the battery 110 are in parallel connection to each other through the DC parallel link nodes $N_{DC}$.

The DC voltage source 130 is not limited to a particular type and may be a different type of a battery from the battery 110.

For example, the battery 110 may be a lithium battery having a nominal voltage of 12V. The DC voltage source 130 may be a lead storage battery having a nominal voltage of 12V.

In another embodiment, the DC voltage source 130 may be a high-capacity condenser. The high-capacity condenser may be included in an input side of a power conversion circuit, e.g., an inverter, when the battery 110 is connected to a load through the power conversion circuit. In FIG. 1, the power conversion circuit and the load are not illustrated.

When the battery 110 is electrically connected to the DC voltage source 130 through the DC parallel link nodes $N_{DC}$, the battery 110 is in parallel connection to the DC voltage source 130.

Therefore, as long as the DC voltage source 130 does not include an active power generating element, a voltage of the battery 110 and a voltage of the DC voltage source 130 have substantially the same value while the parallel connection is maintained.

In an embodiment, the battery 110 and the DC voltage source 130 may be mounted in a vehicle as a parallel power system. Herein, the vehicle may be a fossil-fuel vehicle or a hybrid vehicle.

In the above-described example, the DC voltage source 130 may be a lead storage battery and may be used to provide power to a start motor to start an engine, and to supply operating power to various electric elements included in the vehicle. The lead storage battery may be charged by power generated by a generator or a regeneration charger while the vehicle is being driven. The battery 110 may be a lithium battery and may be used to supplement power of the lead storage battery and to store idle power which is not stored in the lead storage battery but is wasted. When the above-described parallel power system is mounted in the vehicle, the battery 110 may contribute to an increase in fuel efficiency of the vehicle.

Preferably, the switch element failure diagnosis apparatus 100 according to the present disclosure may include a current measuring unit 140, a diagnosis resistor 150, a diagnosis switch 160, and a controller 170 in order to diagnose a failure of the switch element 120.

The current measuring unit 140 may measure a current flowing through the second line $L_2$ between the second electrode 112 of the battery 110 and the second external terminal T− upon a request of the controller 170, and input the measured current value to the controller 170.

In an example, the current measuring unit 140 may include a shunt resistor $R_{SHUNT}$ provided on the second line $L_2$, and an analog-digital converter (ADC) 142.

The ADC 142 converts an analog voltage applied to two terminal ends of the shunt resistor $R_{SHUNT}$ when the current flows through the second line $L_2$, into a digital voltage, and outputs the converted digital voltage to the controller 170 as the measured current value.

When the digital voltage is received as the measured current value from the ADC 142, the controller 170 may determine a current level $I_{SHUNT}$ flowing through the second line $L_2$ based on the Ohm's Law by using a pre-defined resistance value of the shunt resistor $R_{SHUNT}$ and the measured current value.

In another example, the current measuring unit 140 may be replaced with a Hall sensor which is a sort of a current sensor. The Hall sensor may input a voltage value indicating the magnitude of the current flowing through the second line $L_2$, to the controller 170 as the measured current value. Then, the controller 170 may determine the current level $I_{SHUNT}$ flowing through the second line $L_2$, based on pre-defined mathematical calculation by using the voltage value input as the measured current value.

A method of detecting the current level $I_{SHUNT}$ flowing through the second line $L_2$ by using the shunt resistor $R_{SHUNT}$ or the Hall sensor is well known to those skilled in the art and thus will not be further described in detail herein.

Preferably, the diagnosis resistor 150 and the diagnosis switch 160 may be provided on a third line $L_3$ to connect the first and second lines $L_1$ and $L_2$, and the diagnosis resistor 150 and the diagnosis switch 160 may be connected to each other in series.

The diagnosis switch 160 may be turned on by receiving a control signal from the controller 170 when a failure of the switch element 120 needs to be diagnosed, and may be turned off when the failure diagnosis is completed.

Preferably, the third line $L_3$ may be connected to an outer node N+ of the switch element 120 and an outer node N− of the current measuring unit 140. Then, an existing resistor used to measure a charge current or a discharge current may also be used as the shunt resistor 141. That is, the shunt resistor 141 may be used to measure the magnitude of a charge current or a discharge current, and used to measure the magnitude of a current flowing through the second line $L_2$ in order to diagnose a failure of the switch element 120. This may contribute to a reduction in costs of a diagnosis apparatus. In addition, the reliability of diagnosing a failure of the switch element 120 may be increased by increasing the level of a current flowing through the shunt resistor 141.

The switch element failure diagnosis apparatus 100 according to an embodiment of the present disclosure may further include a first voltage measuring unit 180 and a second voltage measuring unit 190 in order to diagnose a failure of the switch element 120.

The first voltage measuring unit 180 measures a first measured voltage value $V_1$ indicating a voltage of the battery 110 applied between the first and second electrodes 111 and 112 of the battery 110, and inputs the same to the controller 170.

The second voltage measuring unit 190 measures a second measured voltage value $V_2$ indicating a voltage applied to the DC parallel link nodes $N_{DC}$, and inputs the same to the controller 170.

The first and second voltage measuring units 180 and 190 may be configured as typical voltage measuring circuits (e.g., differential amplifier circuits) known to those skilled in the art, and thus will not be described in detail herein.

The controller 170 applies a control signal for turning on or off the switch element 120, to the switch element 120. After the control signal is applied, the controller 170 turns on the diagnosis switch 160 and then receives the measured current value from the current measuring unit 140. The controller 170 determines the current level $I_{SHUNT}$ flowing through the second line $L_2$ by using the measured current value. The controller 170 may diagnose a failure of the switch element 120 by comparing the current level $I_{SHUNT}$ to a pre-defined reference current level $I_{th}$.

The controller 170 may selectively include a processor, an application-specific integrated circuit (ASIC), another chipset, a logic circuit, a register, a communication modem, a data processing unit, etc., which are known to those skilled in the art, in order to execute various control logics to be described below. When the control logics are implemented as software, the controller 170 may be implemented as a set of program modules. In this case, the program modules may be stored in a memory and may be executed by a processor. The memory may be provided inside or outside the processor, and may be connected to the processor via various well-known means. Alternatively, the memory may be included in a storage unit 200 to be described below. The memory collectively refers to data storage devices irrespective of device types and is not limited to any particular memory device.

According to an aspect, the controller 170 may apply a control signal for turning off the switch element 120, to the switch element 120, and diagnose that the switch element 120 has a short circuit failure, if the current level $I_{SHUNT}$ determined by using the measured current value input from the current measuring unit 140 is greater than the reference current level $I_{th}$.

According to another aspect, the controller 170 may apply a control signal for turning on the switch element 120, to the switch element 120, and diagnose that the switch element 120 has an open circuit failure, if the current level $I_{SHUNT}$ determined by using the measured current value input from the current measuring unit 140 is less than the reference current level $I_{th}$.

According to still another aspect, the controller 170 may apply a control signal for turning off the switch element 120, to the switch element 120.

The controller 170 may receive the first measured voltage value $V_1$ indicating the voltage of the battery 110 and the second measured voltage value $V_2$ indicating the voltage of the DC parallel link nodes $N_{DC}$ from the first and second voltage measuring units 180 and 190, respectively, and receive the measured current value from the current measuring unit 140 to determine the current level $I_{SHUNT}$ flowing through the second line $L_2$.

The controller 170 may diagnose that the switch element 120 is normal, if a difference between the first measured voltage value $V_1$ indicating the voltage of the battery 110 and the second measured voltage value $V_2$ indicating the voltage of the DC parallel link nodes $N_{DC}$ is greater than a reference voltage level $V_{th}$.

The controller 170 may diagnose that the switch element 120 has a short circuit failure, if the difference between the first measured voltage value $V_1$ indicating the voltage of the battery 110 and the second measured voltage value $V_2$ indicating the voltage of the DC parallel link nodes $N_{DC}$ is less than the reference voltage level $V_{th}$ and if the current level $I_{SHUNT}$ of the second line $L_2$ determined by using the measured current value is greater than the reference current level $I_{th}$.

According to still another aspect, the controller 170 may apply a control signal for turning on the switch element 120, to the switch element 120 in order to diagnose an open circuit failure of the switch element 120.

The controller 170 may receive the first measured voltage value $V_1$ indicating the voltage of the battery 110 and the second measured voltage value $V_2$ indicating the voltage of the DC parallel link nodes $N_{DC}$ from the first and second voltage measuring units 180 and 190, respectively, and receive the measured current value from the current measuring unit 140 to determine the current level $I_{SHUNT}$ of the second line $L_2$.

The controller 170 may diagnose that the switch element 120 has an open circuit failure, if the difference between the first measured voltage value $V_1$ indicating the voltage of the battery 110 and the second measured voltage value $V_2$ indicating the voltage of the DC parallel link nodes $N_{DC}$ is greater than the reference voltage level $V_{th}$.

The controller 170 may diagnose that the switch element 120 operates normally, if the difference between the first measured voltage value $V_1$ indicating the voltage of the battery 110 and the second measured voltage value $V_2$ indicating the voltage of the DC parallel link nodes $N_{DC}$ is less than the reference voltage level $V_{th}$ and if the current level $I_{SHUNT}$ of the second line $L_2$ determined by using the measured current value is greater than the reference current level $I_{th}$.

In the present disclosure, the reference current level $I_{th}$ used for reference to diagnose a short circuit failure of the switch element 120 may include a plurality of current values $I_{th(k)}$ having different magnitudes. Herein, k may be a natural number of 1 to p, and $I_{th(k)}$ may increase in proportion to k.

In this case, the controller 170 may diagnose that the switch element 120 has a short circuit failure, if the current level $I_{SHUNT}$ flowing through the second line $L_2$ is greater than the maximum current value $I_{th(p)}$ among the plurality of current values $I_{th(k)}$ set as the reference current level $I_{th}$.

The controller 170 may identify the maximum current value among current values less than or equal to the current level $I_{SHUNT}$ flowing through the second line $L_2$ among the current values $I_{th(k)}$ set as the reference current level $I_{th}$, and diagnose that the switch element 120 has a pre-defined weak short circuit failure corresponding to the identified maximum current value.

Herein, the weak short circuit failure refers to an intermediate state between a fully short-circuited state and a normal state of the switch element 120. The weak short circuit failure may be pre-defined in a plurality of stages based on levels of a resistance value of the switch element 120 when the switch element 120 is turned off.

The weak short circuit failure may be pre-defined in a plurality of stages based on the magnitudes of the current values $I_{th(k)}$ set as the reference current level $I_{th}$. The current values $I_{th(k)}$ may be pre-defined through a test based on resistance characteristics of the switch element 120.

For example, the magnitudes of the plurality of current values $I_{th(k)}$ to be set as the reference current level $I_{th}$ may be determined by preparing a plurality of switch elements 120 having different resistances due to different levels of weak short circuit failures and then measuring the value of the current flowing through the second line $L_2$ when each switch element 120 is turned off.

According to still another aspect of the present disclosure, the apparatus 100 may further include the storage unit 200 configured to store diagnosis information of the switch element 120. In this case, the controller 170 may store the diagnosis information of the switch element 120 in the storage unit 200. The diagnosis information may include identification code indicating the type of a failure of the switch element 120, and time information when the failure is diagnosed. Preferably, the identification code may include numbers, characters, symbols, or a combination thereof, which indicate the type of the failure of the switch element 120.

The storage unit 200 stores programs required when the controller 170 executes control logics, data generated when the control logics are executed, and pre-defined data used when the control logics are executed.

The storage unit 200 is not limited to a particular type and may be any data storage device such as dynamic random access memory (DRAM), static random access memory (SRAM), read-only memory (ROM), electrically erasable programmable read-only memory (EEPROM), flash memory, or a register.

According to still another aspect of the present disclosure, the apparatus 100 may further include a display unit 210 configured to output the diagnosis information of the switch element 120. In this case, the controller 170 may output the diagnosis information of the switch element 120 on the display unit 210 as a graphic user interface. The diagnosis information may include identification code indicating the type of a failure of the switch element 120, and time information when the failure is diagnosed. Preferably, the identification code may include numbers, characters, symbols, or a combination thereof, which indicate the type of the failure of the switch element 120.

The display unit 210 may not always be included in the apparatus 100 according to the present disclosure, but may be included in another apparatus. In this case, the display unit 210 is connected to the controller 170 not directly but indirectly via a control means included in the other apparatus. Therefore, it should be understood that electrical connection between the display unit 210 and the controller 170 also includes the above-described indirect connection.

When the controller 170 may not directly display the diagnosis information of the switch element 120 on the display unit 210, the controller 170 may provide the diagnosis information to another apparatus including a display. In this case, the controller 170 may be data-communicably connected to the other apparatus, and the other apparatus may receive the diagnosis information of the switch element 120 from the controller 170 and display the received diagnosis information as a graphic user interface on the display connected thereto.

According to still another aspect of the present disclosure, the apparatus 100 may further include a communication interface 220 capable of transmitting or receiving communication data.

The communication interface 220 may support controller area network (CAN), local interconnect network (LIN), FlexRay, or media oriented systems transport (MOST) communication.

The controller 170 may generate communication data including the diagnosis information of the switch element 120 and then output the generated communication data through the communication interface 220. The communication data may be transmitted through a communication network to an external device 230. The external device 230 may receive the communication data, extract the diagnosis information from the communication data, and visually display the extracted diagnosis information on a display connected to the external device 230. For example, the external device 230 may be a diagnosis apparatus exclusively used for the switch element 120, or a main control computer of a load having the battery 110, e.g., a vehicle.

Figure 2:
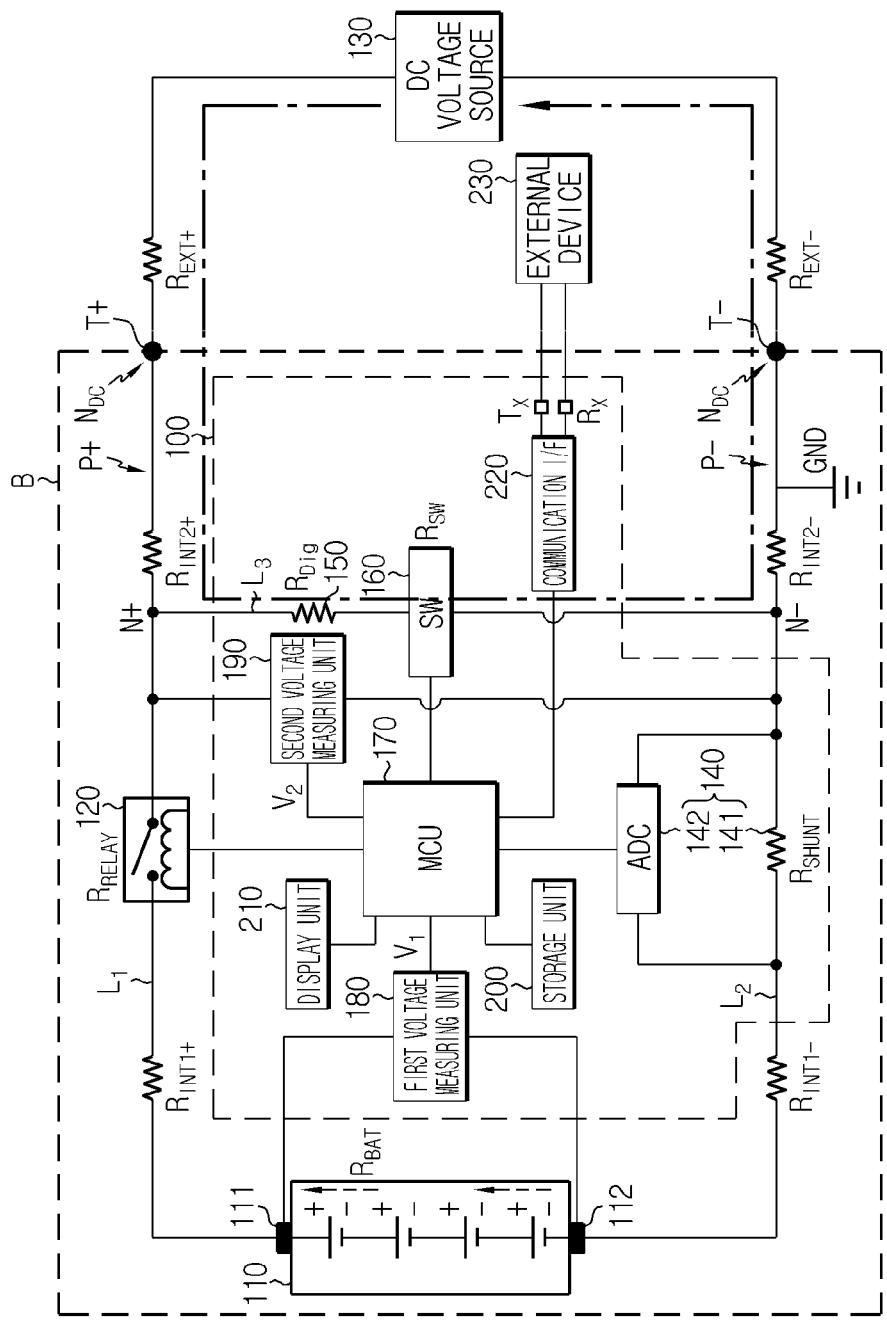
FIG. 2 is a view showing the flow of a current in a circuit of FIG. 1 when the switch element is turned off.

FIG. 2 is a view showing the flow of a current in the circuit of FIG. 1 when the switch element 120 having received a turn-off control signal is normally turned off and the diagnosis switch 160 is turned on.

Referring to FIG. 2, when the switch element 120 is normally turned off, a current flows only in a right closed-loop circuit with respect to the third line $L_3$ and does not flow through the shunt resistor $R_{SHUNT}$. That is, the current level $I_{SHUNT}$ flowing through the second line $L_2$ is close to zero. In the drawing, the flow of the current is indicated by a dashed dotted arrow.

Figure 3:
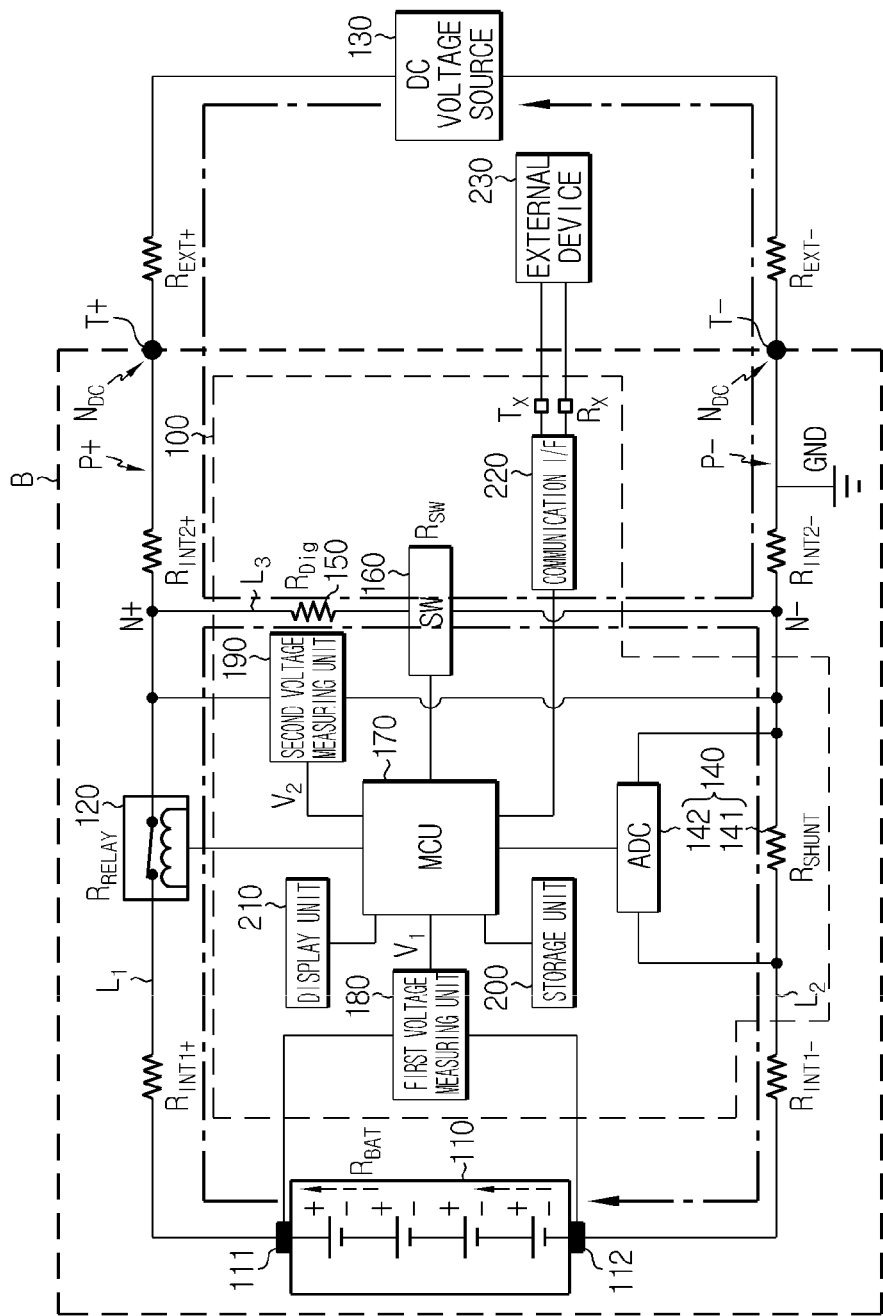

FIG. 3 is a view showing the flow of a current in the circuit of FIG. 1 when the switch element 120 having received a turn-off control signal has a short circuit failure and thus is not normally turned off and the diagnosis switch 160 is turned on.

Referring to FIG. 3, when the switch element 120 has a short circuit failure, a current flows in both closed-loop circuits at left and right sides of the third line $L_3$.

Initially, a current level $I_{L3}$ flowing through the third line $L_3$ may be determined based on the values of resistance components provided on the third line $L_3$ and the magnitude of a voltage applied to two ends of the third line $L_3$ as shown in Mathematical Formula 1.

$$I_{L3} = \frac{V_2}{R_{dig} + R_{SW(on)}} \approx \frac{V_2}{R_{dig}} \quad \langle\text{Mathematical Formula 1}\rangle$$

In Mathematical Formula 1, $I_{L3}$ denotes the magnitude of a current flowing through the third line $L_3$. $V_2$ denotes a second measured voltage value indicating a voltage of the DC parallel link nodes $N_{DC}$ measured by the second voltage measuring unit 190. $R_{dig}$ denotes a pre-defined resistance value of the diagnosis resistor 150. $R_{SW(on)}$ denotes a pre-defined turn-on resistance of the diagnosis switch 160.

Between the two resistance values included in a denominator of Mathematical Formula 1, compared to $R_{dig}$, the value of $R_{SW(on)}$ is negligibly small. Therefore, the current level $I_{L3}$ flowing through the third line $L_3$ may be approximated to $V_2/R_{dig}$.

A current magnitude $I_{RIGHT}$ flowing through a right closed-loop circuit and a current magnitude $I_{LEFT}$ flowing through a left closed-loop circuit may be determined based on a ratio of resistance components included in the right closed-loop circuit to those included in the left closed-loop circuit.

That is, it is assumed that a sum of resistance values of the resistance components included in the right closed-loop circuit is denoted by $R_{RIGHT}$ and a sum of resistance values of the resistance components included in the left closed-loop circuit is denoted by $R_{LEFT}$.

Then, the current magnitude $I_{LEFT}$ flowing through the left closed-loop circuit may be determined as shown in Mathematical Formula 2, and the current magnitude $I_{RIGHT}$ flowing through the right closed-loop circuit may be determined as shown in Mathematical Formula 3.

$$I_{LEFT} = I_{L3} \times \frac{R_{RIGHT}}{R_{RIGHT} + R_{LEFT}} = \quad \langle\text{Mathematical Formula 2}\rangle$$
$$\frac{V_2}{R_{dig} + R_{SW(on)}} \times \frac{R_{RIGHT}}{R_{RIGHT} + R_{LEFT}} \approx \frac{V_2}{R_{dig}} \times \frac{R_{RIGHT}}{R_{RIGHT} + R_{LEFT}}$$

$$I_{RIGHT} = I_{L3} \times \frac{R_{LEFT}}{R_{RIGHT} + R_{LEFT}} = \quad \langle\text{Mathematical Formula 3}\rangle$$
$$\frac{V_2}{R_{dig} + R_{SW(on)}} \times \frac{R_{LEFT}}{R_{RIGHT} + R_{LEFT}} \approx \frac{V_2}{R_{dig}} \times \frac{R_{LEFT}}{R_{RIGHT} + R_{LEFT}}$$

In Mathematical Formulae 2 and 3, $R_{RIGHT}$ denotes a sum of resistance values of resistance components included in a right closed-loop circuit with respect to the third line $L_3$, and may be represented as shown in Mathematical Formula 4.

$$R_{RIGHT} = R_{INT2+} + R_{INT2-} + R_{EXT+} + R_{EXT-} + R_{DC\_SOURCE} \quad \text{<Mathematical Formula 4>}$$

In Mathematical Formulae 2 and 3, $R_{LEFT}$ denotes a sum of resistance values of resistance components included in a left closed-loop circuit with respect to the third line $L_3$, and may be represented as shown in Mathematical Formula 5.

$$R_{LEFT} = R_{INT1+} R_{INT1-} + R_{RELAY} - R_{SHUNT} - R_{BAT} \quad \text{<Mathematical Formula 5>}$$

In Mathematical Formulae 4 and 5, $R_{INT1+}$, $R_{INT1-}$, $R_{INT2+}$, $R_{INT2-}$, $R_{EXT+}$, and $R_{EXT-}$ denote resistance values of resistance components existing on paths through which a current flows. $R_{BAT}$ denotes an internal resistance of the battery 110. $R_{DC\_SOURCE}$ denotes an internal resistance of the DC voltage source 130. $R_{RELAY}$ denotes a turn-on resistance of the switch element 120, and $R_{SHUNT}$ denotes a resistance value of the shunt resistor 141 of the current measuring unit 140.

The resistance values included in Mathematical Formulae 4 and 5 may be pre-defined by measuring resistance value between nodes connected to circuit elements by using a resistance meter. The defined resistance values may be pre-stored in the storage unit 200.

In Mathematical Formulae 4 and 5, each resistance value may have a small value less than several milliohms. Thus, $R_{RIGHT}$ and $R_{LEFT}$ may be approximated to substantially the same value. In this case, the current level $I_{LEFT}$ flowing through the left closed-loop circuit with respect to the third line $L_3$ may be approximated as shown in Mathematical Formula 6.

$$I_{LEFT} \approx \frac{V_2}{R_{Dig}} \times \frac{1}{2} \quad \langle\text{Mathematical Formula 6}\rangle$$

The current level $I_{LEFT}$ flowing through the left closed-loop circuit is substantially the same as the current level $I_{SHUNT}$ of the second line $L_2$, which flows through the shunt resistor 141.

Therefore, according to the present disclosure, a value equal to a current level determined based on Mathematical Formula 6 or a value less than the current level determined based on Mathematical Formula 6 by a certain degree in consideration of a margin of measurement may be defined as the reference current level $I_{th}$.

For the reference current level $I_{th}$, $V_2$ indicating the second measured voltage value measured from the two ends of the third line $L_3$ is an only variable, and $R_{dig}$ denotes a pre-defined resistance value of the diagnosis resistor 150.

Accordingly, if the current level $I_{SHUNT}$ measured by the shunt resistor 141 when the diagnosis switch 160 is turned on after a control signal for turning off the switch element 120 is applied to the switch element 120 is greater than the reference current level $I_{th}$ calculated by using the second measured voltage value $V_2$, it may be diagnosed that the switch element 120 has a short circuit failure. Otherwise, if the current level $I_{SHUNT}$ of the second line $L_2$ measured by the shunt resistor 141 is sufficiently less than the reference current level $I_{th}$, it may be diagnosed that a function of turning off the switch element 120 operates normally.

An open circuit failure of the switch element 120 may be diagnosed by turning on the diagnosis switch 160 after a control signal for turning on the switch element 120 is applied to the switch element 120, and then measuring the current level $I_{SHUNT}$ flowing through the shunt resistor 141.

That is, if the current level $I_{SHUNT}$ flowing through the shunt resistor 141 is greater than the reference current level $I_{th}$ determined by using the second measured voltage value $V_2$, it may be diagnosed that a function of turning on the switch element 120 operates normally. Otherwise, if the current level $I_{SHUNT}$ flowing through the shunt resistor 141 is remarkably less than the reference current level $I_{th}$ determined by using the second measured voltage value $V_2$, it may be diagnosed that that the switch element 120 has an open circuit failure.

According to the present disclosure, a difference between the first and second measured voltage value $V_1$ and $V_2$ measured by using the first and second voltage measuring units 180 and 190 may be calculated and it may be additionally diagnosed whether the switch element 120 operates normally, based on the calculated difference.

For example, if the difference between the first and second measured voltage value $V_1$ and $V_2$ measured by using the first and second voltage measuring units 180 and 190 after a control signal for turning off the switch element 120 is applied to the switch element 120 is greater than the preset reference voltage level $V_{th}$, it may be diagnosed that a function of turning off the switch element 120 operates normally.

As another example, if the difference between the first and second measured voltage value $V_1$ and $V_2$ measured by using the first and second voltage measuring units 180 and 190 after a control signal for turning on the switch element 120 is applied to the switch element 120 is greater than the preset reference voltage level $V_{th}$, it may be diagnosed that the switch element 120 has an open circuit failure and thus a function of turning on the switch element 120 does not operate normally.

The above-described method of diagnosing a failure of the switch element 120 by using the first and second measured voltage value $V_1$ and $V_2$ may be preliminarily performed before a failure of the switch element 120 is diagnosed by using the current level $I_{SHUNT}$ flowing through the shunt resistor 141.

Based on the above description, a method of diagnosing a failure of the switch element 120 by using the switch element failure diagnosis apparatus 100 according to the present disclosure will now be described in detail.

In the following description, although not particularly mentioned, the method according to the present disclosure is performed by the controller 170.

Figure 4:
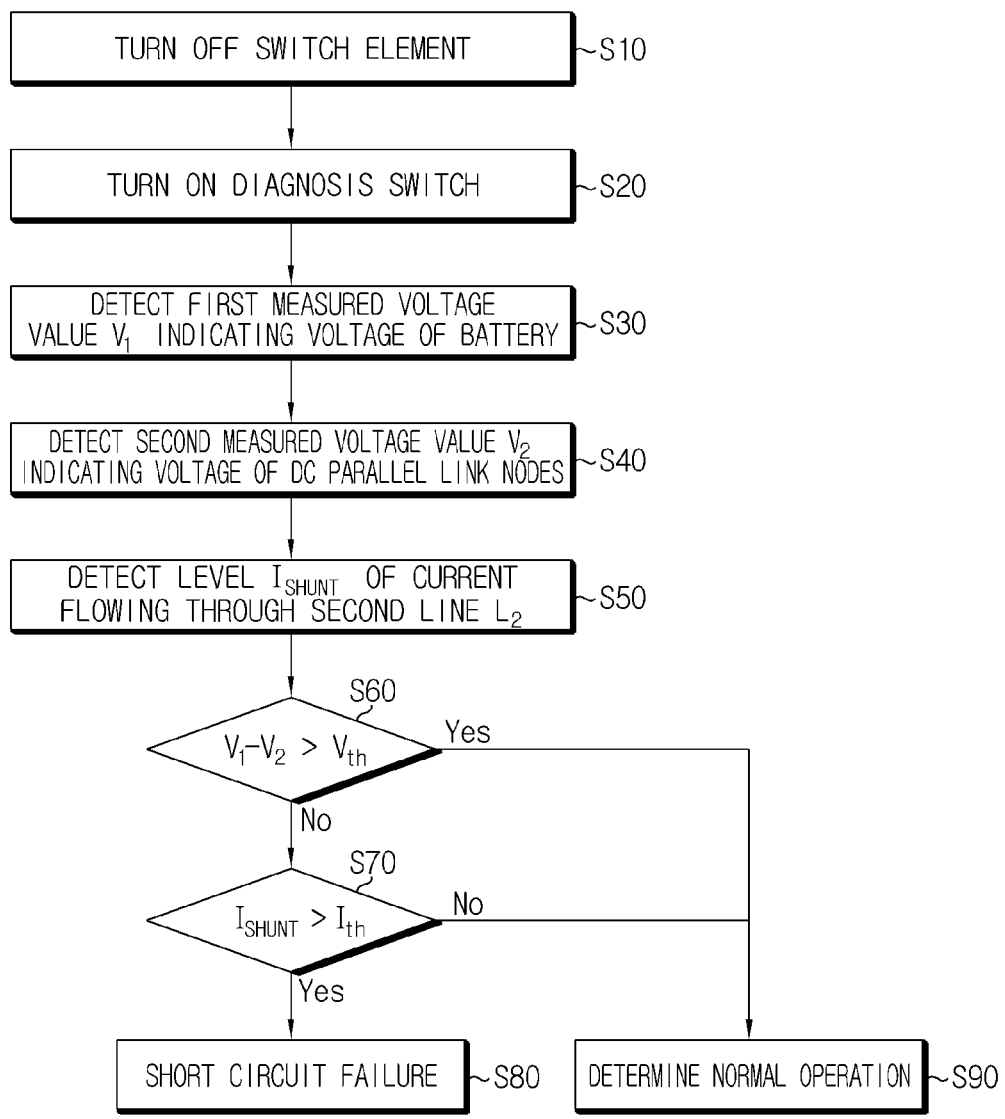
FIG. 4 is a flowchart of a method of diagnosing a short circuit failure of the switch element, according to an embodiment of the present disclosure.

FIG. 4 is a flowchart of a method of diagnosing a short circuit failure of the switch element 120, according to the present disclosure.

Referring to FIG. 4, initially, the controller 170 applies a control signal for turning off the switch element 120, to the switch element 120 in order to diagnose a short circuit failure of the switch element 120 (operation S10).

Subsequently, the controller 170 turns on the diagnosis switch 160 provided on the third line $L_3$, by applying a control signal for turning on the diagnosis switch 160, to the diagnosis switch 160 (operation S20).

Then, the controller 170 controls the first voltage measuring unit 180 and detects a voltage of the battery 110 by receiving the first measured voltage value $V_1$ indicating the voltage of the battery 110, from the first voltage measuring unit 180 (operation S30).

Thereafter, the controller 170 controls the second voltage measuring unit 190 and detects a voltage of the DC parallel link nodes $N_{DC}$ by receiving the second measured voltage value $V_2$ indicating the voltage of the DC parallel link nodes $N_{DC}$, from the second voltage measuring unit 190 (operation S40).

Subsequently, the controller 170 controls the current measuring unit 140 and detects the current level $I_{SHUNT}$ flowing through the second line $L_2$ by receiving a measured current value indicating the current level $I_{SHUNT}$ flowing through the second line $L_2$, from the current measuring unit 140 (operation S50).

Then, the controller 170 calculates a difference between the first measured voltage value $V_1$ indicating the voltage of the battery 110 and the second measured voltage value $V_2$ indicating the voltage of the DC parallel link nodes $N_{DC}$, and determines whether the difference value is greater than the preset reference voltage level $V_{th}$ (operation S60).

Upon determining that the difference between the first and second measured voltage values $V_1$ and $V_2$ is greater than the reference voltage level $V_{th}$ in operation S60, the controller 170 diagnoses that a function of turning off the switch element 120 operates normally (operation S90).

Otherwise, upon determining that the difference between the first and second measured voltage values $V_1$ and $V_2$ is less than the reference voltage level $V_{th}$ in operation S60, the controller 170 proceeds to operation S70.

Thereafter, the controller 170 determines whether the current level $I_{SHUNT}$ of the second line $L_2$ detected in operation S50 is greater than the preset reference current level $I_{th}$ (operation S70).

Upon determining that the current level $I_{SHUNT}$ of the second line $L_2$ is greater than the reference current level $I_{th}$ in operation S70, the controller 170 diagnoses that the switch element 120 has a short circuit failure and thus the function of turning off the switch element 120 does not operate normally (operation S80). Otherwise, upon determining that the current level $I_{SHUNT}$ of the second line $L_2$ is sufficiently less than the reference current level $I_{th}$, the controller 170 diagnoses that the function of turning off the switch element 120 operates normally (operation S90)

For reference, when the switch element 120 has a short circuit failure, a current flows through a left closed-loop circuit with respect to the third line $L_3$ (see FIG. 3), and the magnitude of the current corresponds to the current level $I_{SHUNT}$ detected in operation S50.

The reference current level $I_{th}$ used for reference to diagnose a short circuit failure of the switch element 120 may include a plurality of current values $I_{th(k)}$ having different magnitudes. Herein, k may be a natural number of 1 to p, and $I_{th(k)}$ may increase in proportion to k.

In this case, in operation S70, the controller 170 may diagnose that the switch element 120 has a short circuit failure, if the current level $I_{SHUNT}$ flowing through the second line $L_2$ is greater than the maximum current value $I_{th(p)}$ among the plurality of current values $I_{th(k)}$ set as the reference current level $I_{th}$.

In an embodiment not shown in the drawing, the controller 170 may identify the maximum current value among current values less than or equal to the current level $I_{SHUNT}$ flowing through the second line $L_2$ among the current values $I_{th(k)}$ set as the reference current level $I_{th}$, and diagnose that the switch element 120 has a pre-defined weak short circuit failure corresponding to the identified maximum current value.

The weak short circuit failure may be pre-defined in a plurality of stages based on the magnitudes of the current values $I_{th(k)}$ set as the reference current level $I_{th}$. A method of determining the current values $I_{th(k)}$ through a test has been described above. Information about the plurality of stages of the weak short circuit failure corresponding to the current values $I_{th(k)}$ may be pre-stored in the storage unit 200.

Although not shown in the drawing, the controller 170 may generate diagnosis information of the switch element 120. Herein, the diagnosis information may include time information when the switch element 120 is diagnosed, and identification code for identifying a diagnosis result. The identification code includes numbers, characters, symbols, or a combination thereof.

The controller 170 may store the generated diagnosis information in the storage unit 200, output the generated diagnosis information on the display unit 210 as a graphic user interface, or transmit the generated diagnosis information through the communication interface 220 to the external device 230.

In the above-described control logics, it will be understood that the controller 170 may skip operation S60 and directly proceed to operation S70.

Figure 5:
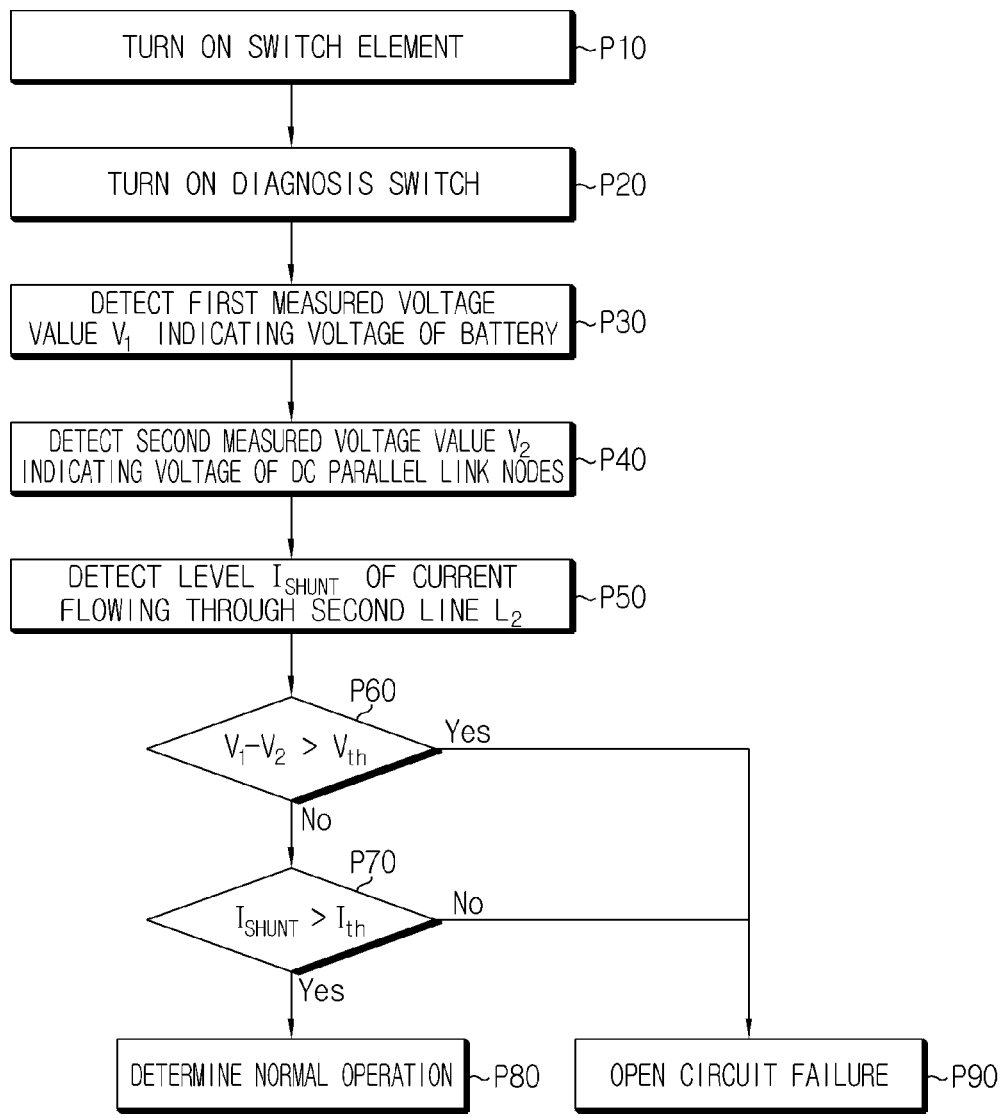
FIG. 5 is a flowchart of a method of diagnosing an open circuit failure of the switch element, according to an embodiment of the present disclosure.

FIG. 5 is a flowchart of a method of diagnosing an open circuit failure of the switch element 120, according to the present disclosure.

Referring to FIG. 5, initially, the controller 170 applies a control signal for turning on the switch element 120, to the switch element 120 in order to diagnose an open circuit failure of the switch element 120 (operation P10).

Subsequently, the controller 170 turns on the diagnosis switch 160 provided on the third line $L_3$, by applying a control signal for turning on the diagnosis switch 160, to the diagnosis switch 160 (operation P20).

Then, the controller 170 controls the first voltage measuring unit 180 and detects a voltage of the battery 110 by receiving the first measured voltage value $V_1$ indicating the voltage of the battery 110, from the first voltage measuring unit 180 (operation P30).

Thereafter, the controller 170 controls the second voltage measuring unit 190 and detects a voltage of the DC parallel link nodes $N_{DC}$ by receiving the second measured voltage value $V_2$ indicating the voltage of the DC parallel link nodes $N_{DC}$, from the second voltage measuring unit 190 (operation P40).

Subsequently, the controller 170 controls the current measuring unit 140 and detects the current level $I_{SHUNT}$ flowing through the second line $L_2$ by receiving a measured current value indicating the current level $I_{SHUNT}$ flowing through the second line $L_2$, from the current measuring unit 140 (operation P50).

Then, the controller 170 calculates a difference between the first measured voltage value $V_1$ indicating the voltage of the battery 110 and the second measured voltage value $V_2$ indicating the voltage of the DC parallel link nodes $N_{DC}$, and determines whether the difference value is greater than the preset reference voltage level $V_{th}$ (operation P60).

Upon determining that the difference between the first and second measured voltage values $V_1$ and $V_2$ is greater than the reference voltage level $V_{th}$ in operation P60, the controller 170 diagnoses that the switch element 120 has an open circuit failure and thus a function of turning on the switch element 120 does not operate normally (operation P90).

Otherwise, upon determining that the difference between the first and second measured voltage values $V_1$ and $V_2$ is sufficiently less than the reference voltage level $V_{th}$ in operation P60, the controller 170 proceeds to operation P70.

Thereafter, the controller 170 determines whether the current level $I_{SHUNT}$ of the second line $L_2$ detected in operation P50 is greater than the preset reference current level $I_{th}$ (operation P70).

Upon determining that the current level $I_{SHUNT}$ of the second line $L_2$ is greater than the reference current level $I_{th}$ in operation P70, the controller 170 diagnoses that the function of turning on the switch element 120 operates normally (operation P80).

Otherwise, upon determining that the current level $I_{SHUNT}$ of the second line $L_2$ is sufficiently less than the reference current level $I_{th}$ in operation P70, the controller 170 diagnoses that the switch element 120 has an open circuit failure and thus the function of turning on the switch element 120 does not operate normally (operation P90)

For reference, when the switch element 120 has an open circuit failure, a current does not flow through a left closed-loop circuit with respect to the third line $L_3$ (see FIG. 2) and thus the current level $I_{SHUNT}$ flowing through the second line $L_2$ has a value of or closed to zero.

Although not shown in the drawing, the controller 170 may generate diagnosis information of the switch element 120 of operation P80 or P90. Herein, the diagnosis information may include time information when the switch element 120 is diagnosed, and identification code for identifying a diagnosis result. The identification code includes numbers, characters, symbols, or a combination thereof.

The controller 170 may store the generated diagnosis information in the storage unit 200, output the generated diagnosis information on the display unit 210 as a graphic user interface, or transmit the generated diagnosis information through the communication interface 220 to the external device 230.

In the above-described control logics, it will be understood that the controller 170 may skip operation P60 and directly proceed to operation P70.

It will be also understood that a selective combination of two or more of the various control logics of the controller 170 may be implemented as an embodiment of the present disclosure.

Two or more of the various control logics of the controller 170 may be combined and the combined control logics may be written based on a computer-readable code system and may be recorded on a computer-readable recording medium.

The recording medium is not limited to a particular type and may be any recording medium accessible by a processor included in a computer. For example, the recording medium includes at least one selected from the group including read-only memory (ROM), random-access memory (RAM), a register, a CD-ROM, magnetic tape, a hard disk, a floppy disk, and an optical data storage device.

The code system may be distributed and stored in computers connected via a network and may be executed by the computers. Also, functional programs, codes, and code segments for implementing the combined control logics can be easily construed by programmers of ordinary skill in the art.

In the above-descriptions of the embodiments of the present disclosure, elements with suffixes such as '-unit' and '-er/-or' should be understood not as physically defined elements but as functionally defined elements. Therefore, each element may be optionally combined with another element or may be divided into sub-elements for efficient execution of control logic(s).

However, even when the elements are combined or divided, it will be understood by those skilled in the art that the combined or divided elements fall within the scope of the present disclosure as long as function identities thereof are shown.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

INDUSTRIAL APPLICABILITY

According to the present disclosure, a failure of a switch element used for external connection of a battery may be diagnosed using a simple hardware configuration irrespective of the level of a voltage applied to an external terminal of the battery.

Furthermore, according to the present disclosure, a sensor element used to measure a charge or discharge current of the battery may also be used to diagnose a failure of the switch element and thus costs of a diagnosis apparatus may be reduced.

In addition, according to the present disclosure, occurrence of a weak short circuit failure in the switch element may also be accurately diagnosed.

Moreover, the present disclosure may be useful for a parallel power system in which the external terminal of the battery is connected to another type of battery in parallel.

What is claimed is:

1. An apparatus for diagnosing a failure of a switch element provided on a first line between a first electrode of a battery and a first external terminal, the apparatus comprising:
    a current measuring unit configured to measure a current flowing through a second line between a second electrode of the battery and a second external terminal;
    a diagnosis resistor and a diagnosis switch provided on a third line parallel to the battery to connect an outer node of the switch element and an outer node of the current measuring unit, the diagnosis resistor being connected in series to the diagnosis switch; and
    a controller configured to:
    apply a control signal for turning on or off the switch element, to the switch element,
    turn on the diagnosis switch after the control signal is applied and then receive a measured current value from the current measuring unit,
    determine a level of the current flowing through the second line, by using the measured current value, and
    diagnose a failure of the switch element by comparing the current level to a reference current level.

2. The apparatus of claim 1, wherein the controller is configured to apply a control signal for turning off the switch element, to the switch element, and to diagnose that the switch element has a short circuit failure, if the current level is greater than the reference current level.

3. The apparatus of claim 1, wherein the reference current level comprises a plurality of current values having different magnitudes, and
    wherein the controller is configured to apply a control signal for turning off the switch element, to the switch element, and to diagnose that the switch element has a short circuit failure, if the current level is greater than a maximum current value among the current values set as the reference current level.

4. The apparatus of claim 1, wherein the reference current level comprises a plurality of current values having different magnitudes, and
    wherein the controller is configured to apply a control signal for turning off the switch element, to the switch element, to identify a current value corresponding to the current level among the current values set as the reference current level, and to diagnose that the switch element has a pre-defined weak short circuit failure corresponding to the identified current value.

5. The apparatus of claim 1, wherein the controller is configured to apply a control signal for turning on the switch element, to the switch element, and to diagnose that the switch element has an open circuit failure, if the current level is less than the reference current level.

6. The apparatus of claim 1, wherein the first and second lines are connected to direct current (DC) parallel link nodes to which a voltage equal to a voltage of the battery is applied.

7. The apparatus of claim 6, further comprising:
    a first voltage measuring unit configured to measure the voltage of the battery; and
    a second voltage measuring unit configured to measure the voltage of the DC parallel link nodes.

8. The apparatus of claim 7, wherein the controller is configured:
    (i) to apply a control signal for turning off the switch element, to the switch element;
    (ii) to receive a first measured voltage value indicating the voltage of the battery and a second measured voltage value indicating the voltage of the DC parallel link nodes from the first and second voltage measuring units, respectively, and receive the measured current value of the second line from the current measuring unit;
    (iii) to diagnose that the switch element is normal, if a difference between the first and second measured voltage values is greater than a reference voltage level; and
    (iv) to diagnose that the switch element has a short circuit failure, if the difference between the first and second measured voltage values is less than the reference voltage level and if the level of the current flowing through the second line is greater than the reference current level.

9. The apparatus of claim 7, wherein the controller is configured:
    (i) to apply a control signal for turning on the switch element, to the switch element;
    (ii) to receive a first measured voltage value indicating the voltage of the battery and a second measured voltage value indicating the voltage of the DC parallel link nodes from the first and second voltage measuring units, respectively, and receive the measured current value of the second line from the current measuring unit;

(iii) to diagnose that the switch element has an open circuit failure, if a difference between the first and second measured voltage values is greater than a reference voltage level; and
(iv) to diagnose that the switch element is normal, if the difference between the first and second measured voltage values is less than the reference voltage level and if the level of the current flowing through the second line is greater than the reference current level.

10. A method of diagnosing a failure of a switch element provided on a first line between a first electrode of a battery and a first external terminal, the method comprising:
    (a) providing a current measuring unit configured to measure a current flowing through a second line between a second electrode of the battery and a second external terminal, and a diagnosis resistor and a diagnosis switch provided on a third line parallel to the battery to connect an outer node of the switch element and an outer node of the current measuring unit, the diagnosis resistor being connected in series to the diagnosis switch;
    (b) applying a control signal for turning off the switch element, to the switch element;
    (c) turning on the diagnosis switch after the control signal is applied and then receiving a measured current value from the current measuring unit; and
    (d) determining a level of the current flowing through the second line, by using the measured current value, and diagnosing that the switch element has a short circuit failure, if the current level is greater than a pre-defined reference current level.

11. The method of claim 10, wherein the reference current level comprises a plurality of current values having different magnitudes, and
    wherein the step (d) comprises diagnosing that the switch element has a short circuit failure, if the current level is greater than a maximum current value among the current values set as the reference current level.

12. The method of claim 10, wherein the reference current level comprises a plurality of current values having different magnitudes, and
    wherein the step (d) comprises identifying a current value corresponding to the current level among the current values set as the reference current level, and diagnosing that the switch element has a pre-defined weak short circuit failure corresponding to the identified current value.

13. A method of diagnosing a failure of a switch element provided on a first line between a first electrode of a battery and a first external terminal, the method comprising:
    (a) providing a current measuring unit configured to measure a magnitude of a current flowing through a second line between a second electrode of the battery and a second external terminal, and a diagnosis resistor and a diagnosis switch provided on a third line parallel to the battery to connect an outer node of the switch element and an outer node of the current measuring unit, the diagnosis resistor being connected in series to the diagnosis switch;
    (b) applying a control signal for turning on the switch element, to the switch element;
    (c) turning on the diagnosis switch after the control signal is applied and then receiving a measured current value from the current measuring unit; and
    (d) determining a level of the current flowing through the second line, by using the measured current value, and diagnosing that the switch element has an open circuit failure, if the current level is less than a pre-defined reference current level.

14. A method of diagnosing a failure of a switch element provided between a first external terminal connected to direct current (DC) parallel link nodes, and a first electrode of a battery, the method comprising:
    (a) providing a current measuring unit configured to measure a magnitude of a current flowing through a second line between a second electrode of the battery and a second external terminal, first and second voltage measuring units configured to measure a voltage of the battery and a voltage of the DC parallel link nodes, respectively, and a diagnosis resistor and a diagnosis switch provided on a third line parallel to the battery to connect an outer node of the switch element and an outer node of the current measuring unit, the diagnosis resistor being connected in series to the diagnosis switch;
    (b) applying a control signal for turning off the switch element, to the switch element;
    (c) turning on the diagnosis switch after the control signal is applied;
    (d) receiving a first measured voltage value indicating the voltage of the battery and a second measured voltage value indicating the voltage of the DC parallel link nodes from the first and second voltage measuring units, respectively;
    (e) receiving a measured current value from the current measuring unit and determining a level of the current flowing through the second line, by using the measured current value;
    (f) diagnosing that the switch element has a short circuit failure, if a difference between the first and second measured voltage values is less than a pre-defined reference voltage level and if the level of the current flowing through the second line is greater than a reference current level; and
    (g) diagnosing that the switch element is normal, if the difference between the first and second measured voltage values is greater than the reference voltage level.

15. A method of diagnosing a failure of a switch element provided on a first line between a first external terminal connected to direct current (DC) parallel link nodes, and a first electrode of a battery, the method comprising:
    (a) providing a current measuring unit configured to measure a magnitude of a current flowing through a second line between a second electrode of the battery and a second external terminal, first and second voltage measuring units configured to measure a voltage of the battery and a voltage of the DC parallel link nodes, respectively, and a diagnosis resistor and a diagnosis switch provided on a third line parallel to the battery to connect an outer node of the switch element and an outer node of the current measuring unit, the diagnosis resistor being connected in series to the diagnosis switch;
    (b) applying a control signal for turning on the switch element, to the switch element;
    (c) turning on the diagnosis switch after the control signal is applied;
    (d) receiving a first measured voltage value indicating the voltage of the battery and a second measured voltage value indicating the voltage of the DC parallel link nodes from the first and second voltage measuring units, respectively;

(e) receiving a measured current value from the current measuring unit and determining a level of the current flowing through the second line;
(f) diagnosing that the switch element has an open circuit failure, if a difference between the first and second measured voltage values is greater than a pre-defined reference voltage level; and
(g) diagnosing that the switch element is normal, if the difference between the first and second measured voltage values is less than the pre-defined reference voltage level and if the level of the current flowing through the second line is greater than a pre-defined reference current level.

* * * * *